United States Patent
Banin et al.

(10) Patent No.: US 9,941,898 B1
(45) Date of Patent: Apr. 10, 2018

(54) SCALABLE INTERLEAVED DIGITAL-TO-TIME CONVERTER CIRCUIT FOR CLOCK GENERATION

(71) Applicant: Intel Corporation, Santa Clara, CA (US)

(72) Inventors: Rotem Banin, Even-Yehuda (IL); Elias Nassar, Haifa (IL); Inbar Falkov, Tel Aviv (IL); Eyal Fayneh, Givatyim (IL); Ofir Degani, Haifa (IL); Sebastian Sievert, Munich (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/391,575

(22) Filed: Dec. 27, 2016

(51) Int. Cl.
| | |
|---|---|
| *H03M 1/50* | (2006.01) |
| *H03M 1/82* | (2006.01) |
| *H03K 5/131* | (2014.01) |
| *H03L 7/091* | (2006.01) |
| *H03K 19/21* | (2006.01) |
| *H03M 1/66* | (2006.01) |
| *H03K 5/00* | (2006.01) |

(52) U.S. Cl.
CPC .............. *H03M 1/82* (2013.01); *H03K 5/131* (2013.01); *H03K 19/21* (2013.01); *H03L 7/091* (2013.01); *H03M 1/662* (2013.01); *H03K 2005/00058* (2013.01)

(58) Field of Classification Search
CPC .......... H03M 1/82; H03M 1/662; H03M 1/00; H03M 1/12; H03L 7/091; H03K 5/131; H03K 19/21; H03K 2005/00058
USPC ................. 341/144, 152, 166, 126
See application file for complete search history.

(56) References Cited

U.S. PATENT DOCUMENTS

| | | | | |
|---|---|---|---|---|
| 6,617,911 | B2* | 9/2003 | Bazes | H03M 1/82 327/389 |
| 8,462,840 | B2* | 6/2013 | Chen | H03M 1/661 375/239 |
| 8,866,654 | B2* | 10/2014 | Mann | G01T 1/17 341/126 |
| 8,988,262 | B2* | 3/2015 | Miyashita | H03K 5/133 341/152 |
| 9,520,890 | B1* | 12/2016 | Ben-Bassat | H03M 1/1014 |
| 9,698,807 | B1* | 7/2017 | Caffee | H03M 1/1009 |
| 2014/0340250 | A1* | 11/2014 | Dosho | H03K 3/0315 341/143 |
| 2015/0381214 | A1* | 12/2015 | Tertinek | G04F 10/005 455/208 |
| 2016/0182072 | A1* | 6/2016 | Preyler | H03L 7/20 327/105 |

* cited by examiner

*Primary Examiner* — Jean B Jeanglaude
(74) *Attorney, Agent, or Firm* — Schwegman Lundberg & Woessner, P.A.

(57) ABSTRACT

Some embodiments include apparatus and methods using a first digital-to-time converter (DTC) circuit to receive an input clock signal and generate a first clock signal based on the input clock signal, a second DTC circuit to receive the input clock signal and generate a second clock signal based on the input clock signal, and an output circuit to receive the first and second clock signals to generate an output clock signal based on the first and second clock signals.

20 Claims, 6 Drawing Sheets

SCALABLE INTERLEAVED DIGITAL-TO-TIME CONVERTER CIRCUIT FOR CLOCK GENERATION

TECHNICAL FIELD

Embodiments described herein pertain to clock signal generation in electronic devices and systems.

BACKGROUND

Many electronic devices perform their operations using timing of a clock signal (or multiple clock signals) generated by a clock generator included in the devices. Phase locked loop (PLL) clock generators are widely used to generate clock signals. A conventional PLL clock generator traditionally has a long frequency transition time when it switches from one frequency to the next during particular operations of the device. During such a frequency transition, the frequency behavior of the clock signal generated by the PLL clock generator is unpredictable. Thus, components in the device that use the clock signal for their operations may need to stop and wait until the PLL clock generator acquires the new frequency. This stop and wait action may hinder the performance of the device and waste device resources.

DETAILED DESCRIPTION

The techniques described herein involve a clock generator that includes DTC circuits coupled in an interleaved configuration. This configuration allows the described clock generator to generate an output clock signal (or output clock signals) with a predictable behavior.

A DTC circuit is often used in electronic devices to convert digital information that represents the phase (e.g., timing) of a signal into actual phase modulation of an input clock signal (e.g., unmodulated local oscillator signal). By applying different values for such digital information, different clock signals having different frequencies can be generated by the DTC circuits based on the input clock signal.

An example clock generator described herein includes interleaved DTC circuits and an output circuit, which can have logic circuitry, to combine clock signals generated by the interleaved DTC circuits to provide an output clock signal or multiple output clock signals. The interleaved DTC circuits and the output circuit can be configured, such that the frequency of the output clock signal generated by the clock generator can be less than, equal to, or greater than the frequency of an input clock signal. Unlike a PLL circuit, a DTC circuit can change the frequency of its output clock signal in a single step in which transition time can be negligible. Using interleaved DTC circuits in the clock generator described herein allows the component (e.g., a processing core) that uses the output clock signal (generated by the described clock generator) to operate continuously and avoid stopping and waiting during a frequency transition of the DTC circuit of the clock generator. Other improvements and benefits of the techniques described herein are discussed below.

Figure 1:
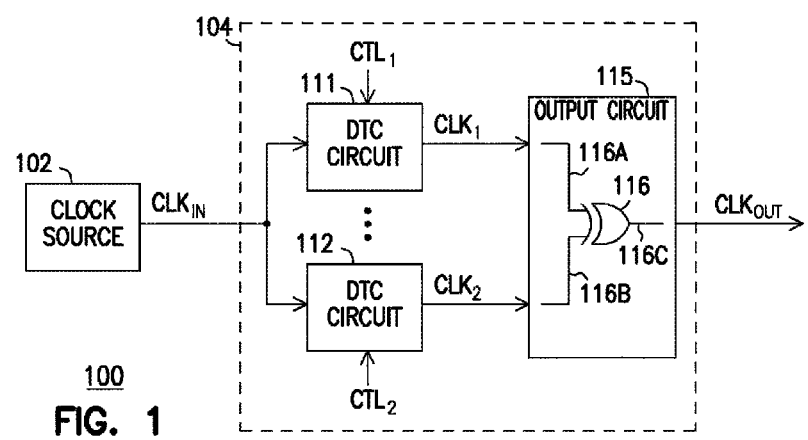
FIG. 1 shows an apparatus in the form of a clock generator including a two-way interleaved digital-to-time converter (DTC) circuit, according to some embodiments described herein.

FIG. 1 shows an apparatus in the form of a clock generator 100 including a two-way interleaved DTC circuit, according to some embodiments described herein. Clock generator 100 can include a clock source 102 that can provide a clock signal (e.g., input lock signal) $CLK_{IN}$ and a digital-to-time circuitry 104 to receive clock signal $CLK_{IN}$ and generate a clock signal (e.g., output clock signal) $CLK_{OUT}$. Clock source 102 can include any combination of a crystal oscillator, a PLL, a delay locked loop (DLL), and other circuitry (or components) that can generate a clock signal (e.g., clock signal $CLK_{IN}$). As an example, clock source 102 can include a PLL where clock signal $CLK_{IN}$ can be provided at an output node of the PLL. In this example, digital-to-time circuitry 104 can include an input node coupled to the output node of the PLL to receive clock signal $CLK_{IN}$ from the PLL.

As shown in FIG. 1, digital-to-time circuitry 104 can include a DTC circuit 111, a DTC circuit 112, and an output circuit 115. DTC circuit 111 can receive clock signal $CLK_{IN}$ and generate clock signal $CLK_1$. DTC circuit 112 can receive clock signal $CLK_{IN}$ and generate clock signal $CLK_2$. Output circuit 115 can receive clock signals $CLK_1$ and $CLK_2$ and generate clock signal $CLK_{OUT}$ based on clock signals $CLK_1$ and $CLK_2$. The frequency of clock signal $CLK_{OUT}$ can be less than, equal to, or greater than the frequency of clock signal $CLK_{IN}$. The frequency of clock signal $CLK_{IN}$ can be an integer or a non-integer multiple of the frequency of clock signal $CLK_{OUT}$. For example, if $f_{CLK\_IN}$ is the frequency of clock signal $CLK_{IN}$ and $f_{CLK\_OUT}$ is the frequency of clock signal $CLK_{OUT}$, then $f_{CLK\_IN}=x\ f_{OUT}$, where "x" can be an integer or a non-integer.

DTC circuit 111 can receive control information (e.g., digital codes) $CTL_1$, which can have values (e.g., predetermined values) to cause DTC circuit 111 to generate clock signal $CLK_1$, such that the frequency of clock signal $CLK_1$ can be less than the frequency of clock signal $CLK_{IN}$, and the frequency of clock signal $CLK_{IN}$ can be an integer or a non-integer multiple of the frequency of clock signal $CLK_1$. For example, if $f_{CLK\_IN}$ is the frequency of clock signal $CLK_{IN}$ and $f_{CLK1}$ is the frequency of clock signal $CLK_1$, then $f_{CLK\_IN}=n\ f_{CLK1}$, where "n" can be an integer or a non-integer.

Similarly, DTC circuit 112 can receive control information (e.g., digital codes) $CTL_2$, which can have values (e.g., predetermined values) to cause DTC circuit 112 to generate clock signal $CLK_2$, such that the frequency of clock signal $CLK_2$ can be less than the frequency of clock signal $CLK_{IN}$, and the frequency of clock signal $CLK_{IN}$ can be an integer or a non-integer multiple of the frequency of clock signal $CLK_2$. For example, if $f_{CLK2}$ is the frequency of clock signal $CLK_2$, then $f_{CLK\_IN}=m\ f_{CLK2}$, where "m" can be an integer or a non-integer.

Control information $CTL_1$ and control information $CTL_2$ can have the same value or different values, such that the relationships between clock signals $CLK_1$ and $CLK_2$ can be any combination of frequencies and phases. For example, clock signals $CLK_1$ and $CLK_2$ can have any of the following relationships: same frequency and same phase, same frequency and different phases, different frequencies and same phase, and different frequencies and difference phases.

As shown in FIG. 1, DTC circuits 111 and 112 can share clock signal $CLK_{IN}$. However, DTC circuits 111 and 112 can be configured to modulate different edges of clock signal $CLK_{IN}$. For example, DTC circuit 111 can be configured to receive control information $CLK_1$ and modulate the rising edge of clock signal $CLK_{IN}$ (based on control information $CTL_1$), such that the rising edge of clock signal $CLK_1$ can be synchronized (e.g., aligned) with the rising edges of clock signal $CLK_{IN}$. In another example, DTC circuit 112 can be configured to receive control information $CTL_2$ and modulate the falling edge of clock signal $CLK_{IN}$ (based on control information $CTL_2$), such that the rising edge of clock signal $CLK_2$ can be synchronized (e.g., aligned) with the falling edges of clock signal $CLK_{IN}$. Modulating both rising and falling edges of clock signal $CLK_{IN}$ using separate DTC circuit 111 and DTC circuit 112, respectively, allow clock signal $CLK_{OUT}$ to have a 50% duty cycle. In the example of FIG. 1, DTC circuit 111 can control the phase (or time) of the combined output rising edges (rising edges of clock signal $CLK_{OUT}$) and DTC circuit 112 can control the phase of the combined output falling edges (rising edges of clock signal $CLK_{OUT}$).

The 50% duty cycle of clock signal $CLK_{OUT}$ allows it to be used in many devices and systems (e.g., including system-on-chip (SoC)), clocking application schemes, and digital interfaces and connections. Examples of such digital interfaces and connections include Universal Serial Bus (USB), DisplayPort (DP), High-Definition Multimedia Interface (HDMI), Thunderbolt, Peripheral Component Interconnect Express (PCIe), Ethernet, and other digital interfaces specifications.

Output circuit 115 of clock generator 100 of FIG. 1 can include a logic circuit that can perform a logic function on clock signals $CLK_1$ and $CLK_2$ and generate clock signal $CLK_{OUT}$ having a waveform based on the logic function. For example, as shown in FIG. 1, output circuit 115 can include a logic gate (e.g., exclusive-OR (XOR) gate) 116, which can include input nodes 116A and 116B to receive clock signals $CLK_1$ and $CLK_2$ from the outputs (e.g., output nodes) of respective DTC circuits 111 and 112. Logic gate 116 can include an output node 116C to provide clock signal $CLK_{OUT}$.

Figure 2:
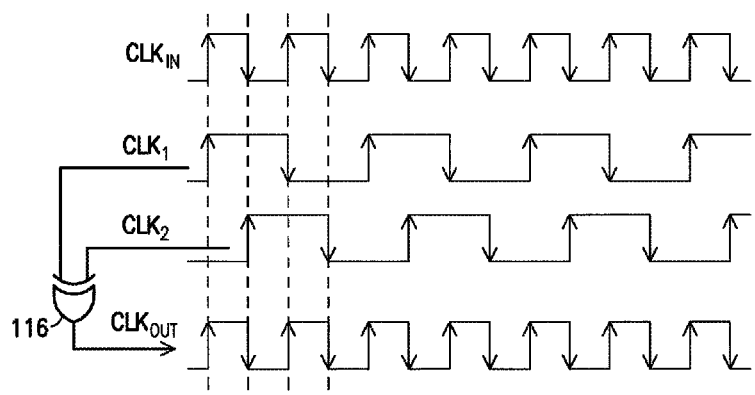
FIG. 2 is an example timing diagram showing timing relationships among clock signals of the clock generator of FIG. 1, according to some embodiments described herein.

FIG. 2 is an example timing diagram showing timing relationships among clock signals $CLK_{IN}$, $CLK_1$, $CLK_2$, and $CLK_{OUT}$, according to some embodiments described herein. In the example of FIG. 2, DTC circuits 111 and 112 are configured to generate respective clock signals $CLK_1$ and $CLK_2$, such that the frequency of each of clock signals $CLK_1$ and $CLK_2$ is equal to one-half of the frequency of clock signal $CLK_{IN}$ (e.g., $f_{CLK1}=\frac{1}{2}f_{CLK\_IN}$, and $f_{CLK2}=\frac{1}{2}f_{CLK\_IN}$). In some operations, causing the frequency of each of clock signals $CLK_1$ and $CLK_2$ to be equal to one-half of the frequency of clock signal $CLK_{IN}$ allows for easier design of both analog and digital blocks in clock generator 100.

As shown in FIG. 2, input node 116A of logic gate 116 can receive clock signal $CLK_1$ (generated by DTC circuit 111) and input node 116B of logic gate 116 can receive clock signal $CLK_2$ (generated by DTC circuit 112). Logic gate 116 can perform a logic function (e.g., XOR function) on clock signals $CLK_1$ and $CLK_2$ and generate clock signal $CLK_{OUT}$ at output node 116C. As shown in FIG. 2, the frequency of $CLK_{OUT}$ is equal to the frequency of clock signal $CLK_{IN}$ (e.g., $f_{CLK\_OUT}=f_{CLK\_IN}$, where $f_{CLK\_OUT}$ is the frequency of clock signal $CLK_{OUT}$ and $f_{CLK\_IN}$ is the frequency of clock signal $CLK_{IN}$). Thus, the operation of logic gate 116 can increase (e.g., double) the frequency of each of clock signals $CLK_1$ and $CLK_2$.

FIG. 1 and FIG. 2 show logic gate 116 being an XOR gate as an example. However, logic gate 116 can be a different type of logic circuit as long as such logic circuit can receive clock signals $CLK_1$ and $CLK_2$ from DTC circuits 111 and 112, respectively, and generate clock signal $CLK_{OUT}$ based on clock signals $CLK_1$ and $CLK_2$. Alternatively, output circuit 115 can include different components (e.g., components different from logic gates) as long as such components can receive clock signals $CLK_1$ and $CLK_2$ from DTC circuits 111 and 112, respectively, and generate clock signal $CLK_{OUT}$ based on clock signals $CLK_1$ and $CLK_2$. However, using logic circuit (e.g., logic gate) as shown in FIG. 1 to combine clock signals $CLK_1$ and $CLK_2$ to generate clock signal $CLK_{OUT}$ may consume less power than using some other types of circuitry.

FIG. 1 and FIG. 2 show an example of clock generator 100 where DTC circuits 111 and 112 operate to generate respective clock signals $CLK_1$ and $CLK_2$ having a frequency equal to one-half of the frequency of clock signal $CLK_{IN}$, and output circuit 115 operates to generate clock signal $CLK_{OUT}$ having a 50% duty cycle. However, clock generator 100 can have different combinations of the number of DTC circuits, different numbers of logic gates, and different frequencies of clock signals generated by the number of DTC circuits relative to the frequency of the input clock signal (e.g., $CLK_{IN}$) in order to generate clock signal $CLK_{OUT}$, which can have a 50% duty cycle or a different duty cycle.

FIG. 1 shows two interleaved DTC circuits as an example. However, the interleaved configuration of DTC circuits 111 and 112 can be extended to different interleaved configurations of DTC circuits (e.g., interleaving more than two DTC circuits based on timing (e.g., frequency, phase, or both) of clock signal $CLK_{IN}$. This means that the architecture (e.g., interleaved configuration) described herein is a scalable architecture. For example, if the frequency of clock signal $CLK_{IN}$ is $f_{CLK\_IN}=X$ Ghz (where X is a real number), one DTC circuit may be used to provide clock signal $CLK_{OUT}$ with a frequency of $\frac{1}{4}X$ GHz, two interleaved DTC circuits may be used to provide clock signal $CLK_{OUT}$ with a frequency of $\frac{1}{2}$ X GHz, and four interleaved DTC circuits may be used to provide clock signal $CLK_{OUT}$ with a frequency of X GHz (equal to the frequency of clock signal $CLK_{IN}$). In another example, D (where D>4) interleaved DTC circuits may be used to provide clock signal $CLK_{OUT}$ with a frequency of Y GHz (where Y>X). Thus, the number of interleaved DTC circuits can be selected to generate clock signal $CLK_{OUT}$, such that the frequency of clock signal $CLK_{OUT}$ generated by clock generator 100 can be less than, equal to, or greater than the frequency of clock signal $CLK_{IN}$.

Figure 3:
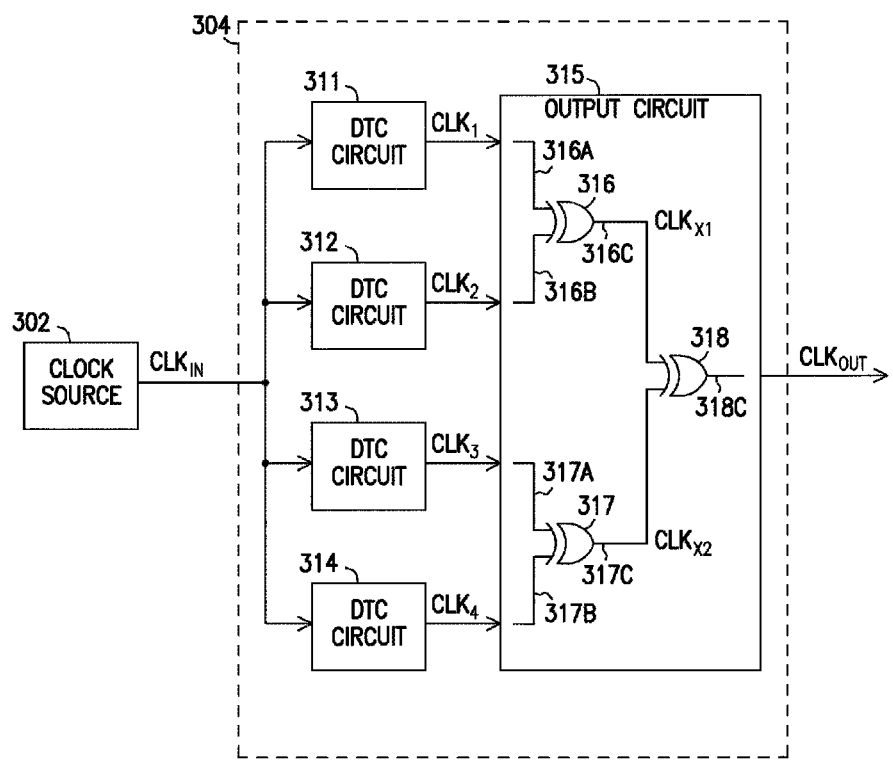
FIG. 3 shows an apparatus in the form of a clock generator including a four-way interleaved DTC circuit, according to some embodiments described herein.

FIG. 3 shows an apparatus in the form of a clock generator 300 including a four-way interleaved DTC circuit, according to some embodiments described herein. Clock generator 300 can include a clock source 302 that can provide a clock signal $CLK_{IN}$ and a digital-to-time circuitry 304 to receive clock signal $CLK_{IN}$ and generate a clock signal $CLK_{OUT}$. Clock source 302 can include any combination of a crystal oscillator, a PLL, a DLL, and other circuitry (or components) that can generate a clock signal (e.g., clock signal $CLK_{IN}$).

As shown in FIG. 3, digital-to-time circuitry 304 can include DTC circuits 311, 312, 313, and 314, and an output circuit 315. DTC circuits 311, 312, 313, and 314 can receive clock signal $CLK_{IN}$ and generate clock signals $CLK_1$, $CLK_2$, $CLK_3$, and $CLK_4$, respectively. Output circuit 315 can receive clock signals $CLK_1$, $CLK_2$, $CLK_3$, and $CLK_4$, and generate clock signal $CLK_{OUT}$ based on clock signals $CLK_1$, $CLK_2$, $CLK_3$, and $CLK_4$.

Output circuit 315 can include a logic circuit that can perform a logic function on clock signals $CLK_1$, $CLK_2$, $CLK_3$, and $CLK_4$, and generate clock signal $CLK_{OUT}$ having a waveform based the logic function. For example, output circuit 315 can include logic gates (e.g., XOR gates) 316, 317, and 318. Logic gate 316 can include input nodes 316A and 316B to receive clock signals $CLK_1$ and $CLK_2$ from the outputs (e.g., output nodes) of respective DTC circuits 311 and 312, and an output node 316C to provide a signal $CLK_{X1}$. Logic gate 317 can include input nodes 317A and 317B to receive clock signals $CLK_3$, and $CLK_4$ from the outputs (e.g., output nodes) of respective DTC circuits 313 and 314, and an output node 317C to provide a signal $CLK_{X2}$. Logic gate 318 can include input nodes coupled to respective output nodes 316C and 317C of logic gates 316 and 317, respectively, to receive clock signals $CLK_{X1}$ and $CLK_{X2}$. Logic gate 318 can generate clock signal $CLK_{OUT}$ at its output node 318C based on the values of signals $CLK_{X1}$ and $CLK_{X2}$.

Figure 4:
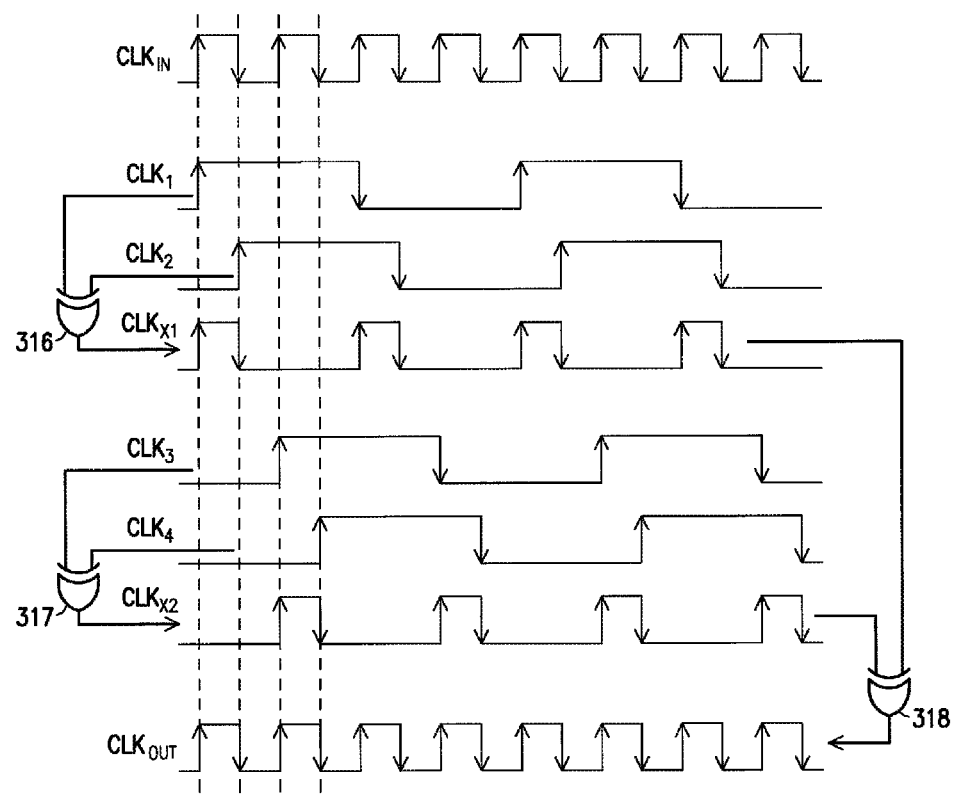
FIG. 4 is an example timing diagram showing timing relationships among clock signals of the clock generator of FIG. 3, according to some embodiments described herein.

FIG. 4 is an example timing diagram showing timing relationships among clock signal $CLK_{IN}$, $CLK_1$, $CLK_2$, $CLK_3$, and $CLK_4$, and $CLK_{OUT}$, according to some embodiments described herein. In the example of FIG. 4, DTC circuits 311, 312, 313, and 314 (FIG. 3) are configured to generate clock signals $CLK_1$, $CLK_2$, $CLK_3$, and $CLK_4$, respectively, in which the frequency of each of clock signals $CLK_1$, $CLK_2$, $CLK_3$, and $CLK_4$ is equal to one-fourth of the frequency of clock signal $CLK_{IN}$ (e.g., $f_{CLK1}=\frac{1}{4}f_{CLK\_IN}$, $f_{CLK2}=f_{CLK\_IN}$, $f_{CLK3}=\frac{1}{4}f_{CLK\_IN}$, and $\frac{1}{4}f_{CLK\_IN}$).

Each of DTC circuits 311 and 313 (FIG. 3) can be configured to modulate the rising edge of clock signal $CLK_1$, such that the rising edge of clock signals $CLK_1$ and $CLK_3$ can be synchronized (e.g., aligned) with the rising edges of clock signal $CLK_{IN}$ Each of DTC circuits 312 and 314 (FIG. 3) can be configured to modulate the falling edge of clock signal $CLK_{IN}$, such that the rising edge of clock signals $CLK_2$ and $CLK_4$ can be synchronized (e.g., aligned) with the falling edges of clock signal $CLK_{IN}$.

As shown in FIG. 4, logic gate 316 can generate signal $CLK_{X1}$ based on clock signals $CLK_1$ and $CLK_2$. Logic gate 317 can generate signal $CLK_{X2}$ based on clock signals $CLK_3$ and $CLK_4$. Logic gate 318 can generate clock signal $CLK_{OUT}$ based on clock signals $CLK_{X1}$ and $CLK_{X2}$. The frequency of clock signal $CLK_{OUT}$ can be equal to the frequency of clock signal $CLK_{IN}$ (e.g., $f_{CLK\_OUT}=f_{CLK\_IN}$, where $f_{CLK\_OUT}$ is the frequency of clock signal $CLK_{OUT}$ and $f_{CLK\_IN}$ is the frequency of clock signal $CLK_{IN}$).

FIG. 3 and FIG. 4 show output circuit 315 including logic gates as an example. However, output circuit 315 can include different components as long as such components can receive clock signals $CLK_1$, $CLK_2$, $CLK_3$, and $CLK_4$ from DTC circuits 311, 312, 313, and 314, respectively, and generate clock signal $CLK_{OUT}$ based on clock signals $CLK_1$, $CLK_2$, $CLK_3$, and $CLK_4$. However, using logic circuit (e.g., logic gates) as shown in FIG. 3 to combine clock signals $CLK_1$, $CLK_2$, $CLK_3$, and $CLK_4$ to generate clock signal $CLK_{OUT}$ may consume less power than using some other types of circuitry.

Figure 5:
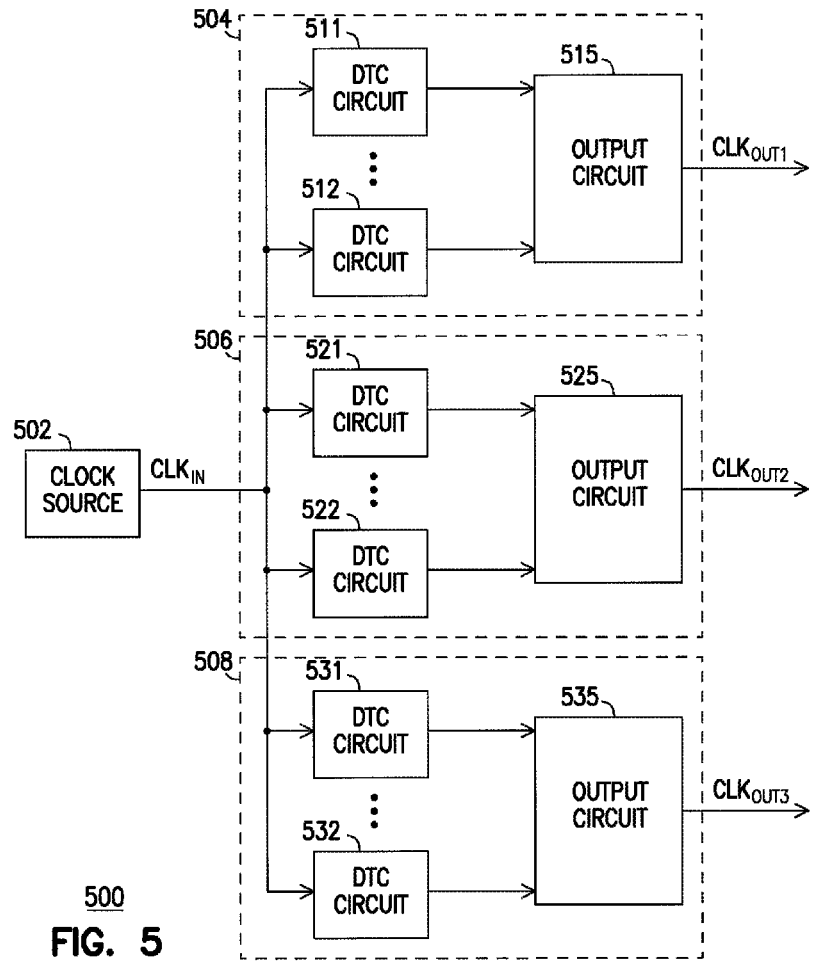
FIG. 5 shows an apparatus in the form of a clock generator including multiple digital-to-time circuitry to generate multiple output clock signals, according to some embodiments described herein.

FIG. 5 shows an apparatus in the form of a clock generator 500 including multiple digital-to-time circuitry 504, 506, and 508 to generate multiple output clock signals, according to some embodiments described herein. As shown in FIG. 5, clock generator 500 can include a clock source 502 that can provide a clock signal $CLK_{IN}$ to digital-to-time circuitry 504, 506, and 508, which generate respective clock signals $CLK_{OUT1}$, $CLK_{OUT2}$, and $CLK_{OUT3}$. Clock source 502 can include any combination of a crystal oscillator, a PLL, a DLL, and other circuitry (or components) that can generate a clock signal (e.g., clock signal $CLK_{IN}$). Clock signals $CLK_{OUT1}$, $CLK_{OUT2}$, and $CLK_{OUT3}$ can have different frequencies, different phases, or both.

At least one of digital-to-time circuitry 504, 506, and 508 can include digital-to-time circuitry 104 of FIG. 1 or digital-to-time circuitry 304 of FIG. 3.

As shown in FIG. 5, digital-to-time circuitry 504 can include DTC circuit 511 and 512, and an output circuit 515. Digital-to-time circuitry 506 can include DTC circuit 521 and 522, and an output circuit 525. Digital-to-time circuitry 508 can include DTC circuit 531 and 532, and an output circuit 535.

As shown in FIG. 5, each of DTC circuits 511, 512, 521, 522, 531, and 532 can share the same clock signal $CLK_{IN}$ provided by clock source 502. As an example, clock source 102 can include a PLL where signal clock signal $CLK_{IN}$ can be provided at an output node of the PLL. In this example, each of DTC circuits 511, 512, 521, 522, 531, and 532 can have an input node coupled to the output node of the PLL to receive the clock signal $CLK_{IN}$.

FIG. 5 shows each of digital-to-time circuitry 504, 506, and 508 including two digital-to-time circuitries as an example. Each of digital-to-time circuitry 504, 506, and 508 can have a different number of DTC circuits.

In clock generator 500, each of digital-to-time circuitry 504, 506, and 508 can operate as a frequency divider with very low quantization noise and the ability to program a different division ratio every cycle. This allows digital-to-time circuitry 504, 506, and 508 to generate respective clock signals $CLK_{OUT1}$, $CLK_{OUT2}$, and $CLK_{OUT3}$, in which each of clock signals $CLK_{OUT1}$, $CLK_{OUT2}$, and $CLK_{OUT3}$ can change its frequency in a single cycle and maintain phase alignment. This is an improvement over conventional PLL clock generators in which, as mentioned above, a frequency transition in conventional PLL clock generators may cause unpredictable behavior of the output clock signal. Further, since each of digital-to-time circuitry 504, 506, and 508 can generate respective clock signals $CLK_{OUT1}$, $CLK_{OUT2}$, and $CLK_{OUT3}$ with different frequencies, clock generator 600 can support a wider range of output frequency in comparison with conventional PLL clock generators. Moreover, clock generator 600 can apply modulation (e.g., spread-spectrum clocking) of the clock to mitigate electromagnetic interference (EMI).

Figure 6:
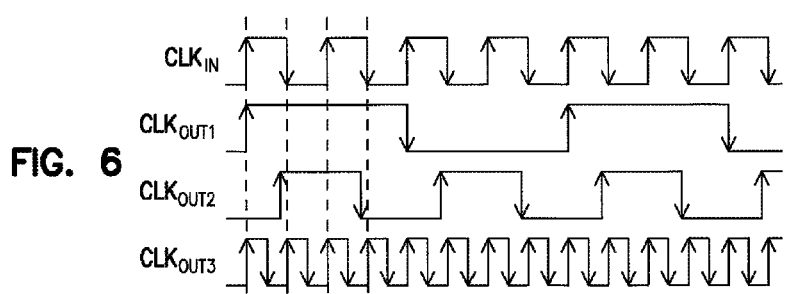
FIG. 6 is a timing diagram showing timing relationships among clock signals of the clock generator of FIG. 5, according to some embodiments described herein.

FIG. 6 is a timing diagram showing timing relationships among clock signals $CLK_{IN}$, $CLK_{OUT1}$, $CLK_{OUT2}$, and $CLK_{OUT3}$ of FIG. 5, according to some embodiments described herein. As shown in FIG. 6, clock signals $CLK_{OUT1}$, $CLK_{OUT2}$, and $CLK_{OUT3}$ can have different frequencies among each other. For example, clock signal $CLK_{OUT2}$ can have a frequency greater than the frequency of clock signal $CLK_{OUT1}$ and less than the frequency of clock signal $CLK_{OUT3}$. Each of clock signal $CLK_{OUT1}$, $CLK_{OUT2}$, and $CLK_{OUT3}$ can also have a frequency different from the frequency of clock signal $CLK_{IN}$. For example, each of clock signals $CLK_{OUT1}$ and $CLK_{OUT2}$ can have a frequency less than the frequency of clock signal $CLK_{IN}$; and clock signal $CLK_{OUT3}$ has a frequency greater than the frequency of clock signal $CLK_{IN}$. FIG. 6 shows specific frequencies and phases among clock signals $CLK_{IN}$, $CLK_{OUT1}$, $CLK_{OUT2}$, and $CLK_{OUT3}$, as an example. However, clock signals $CLK_{IN}$, $CLK_{OUT1}$, $CLK_{OUT2}$, and $CLK_{OUT3}$ can have other combinations of frequencies and phases different from those shown in FIG. 6.

Figure 7:
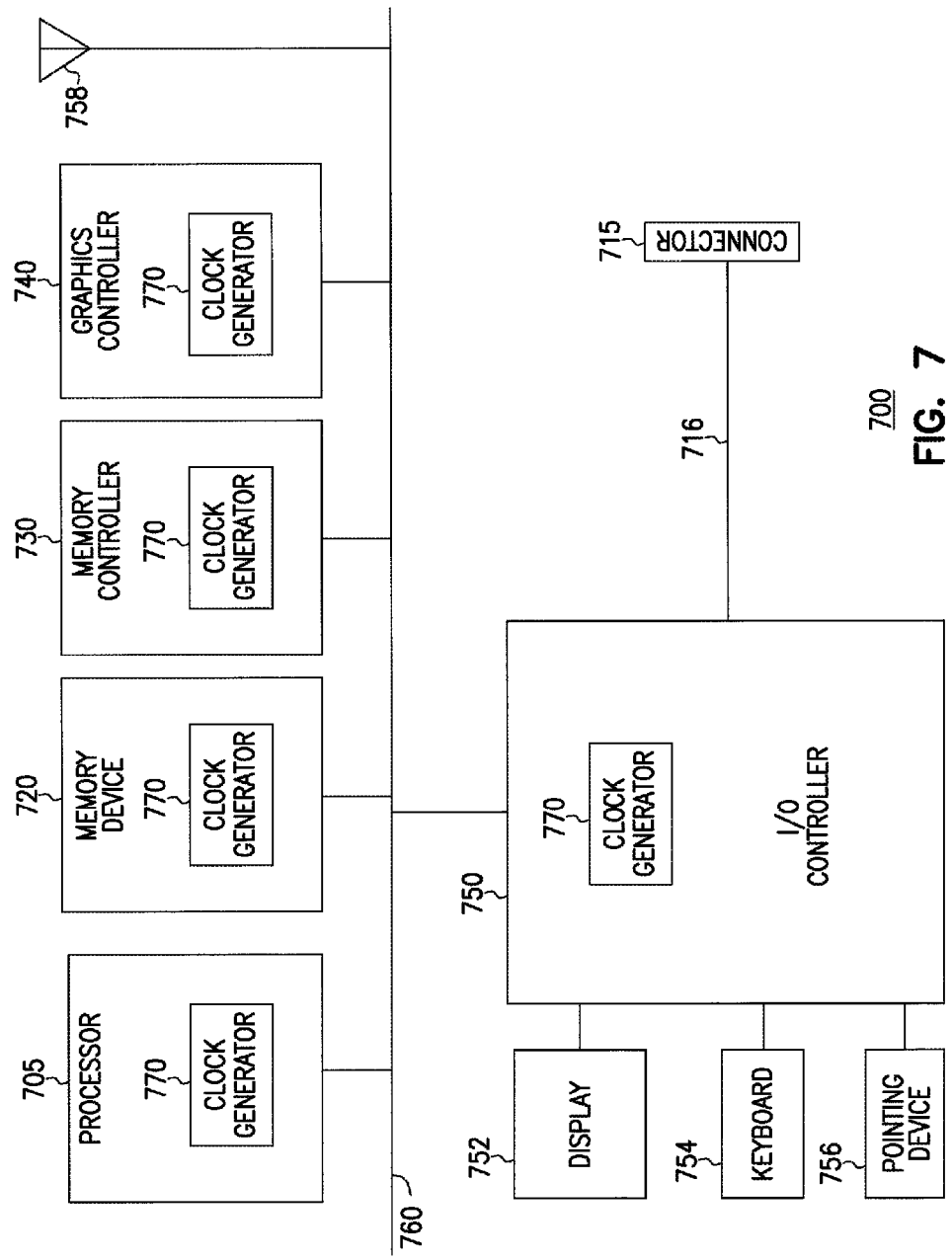
FIG. 7 shows an apparatus in the form of a system (e.g., electronic system), according to some embodiments described herein.

FIG. 7 shows an apparatus in the form of a system (e.g., electronic system) 700, according to some embodiments described herein. System 700 can include or be included in a computer, a tablet, or other electronic systems. As shown in FIG. 7, system 700 can include a processor 705, a memory device 720, a memory controller 730, a graphics controller 740, an input/output (I/O) controller 750, a display 752, a keyboard 754, a pointing device 756, at least one antenna 758, a connector 715, and a bus 760.

Each of processor 705, memory device 720, memory controller 730, graphics controller 740, and I/O controller 750 can include an IC chip (e.g., device 101 or 102 of FIG. 1).

In some arrangements, system 700 does not have to include a display. Thus, display 752 can be omitted from system 700. In some arrangements, system 700 does not have to include any antenna. Thus, antenna 758 can be omitted from system 700.

Processor 705 can include a general-purpose processor or an application specific integrated circuit (ASIC). Processor 705 can include a central processing unit (CPU).

Memory device 720 can include a dynamic random access memory (DRAM) device, a static random access memory (SRAM) device, a flash memory device, phase change memory, a combination of these memory devices, or other types of memory. FIG. 7 shows an example where memory device 720 is a stand-alone memory device separated from processor 705. In an alternative arrangement, memory device 720 and processor 705 can be located on the same die. In such an alternative arrangement, memory device 720 is an embedded memory in processor 705, such as embedded DRAM (eDRAM), embedded SRAM (eSRAM), embedded flash memory, or another type of embedded memory.

Display 752 can include a liquid crystal display (LCD), a touchscreen (e.g., capacitive or resistive touchscreen), or another type of display. Pointing device 756 can include a mouse, a stylus, or another type of pointing device.

I/O controller 750 can include a communication module for wired or wireless communication (e.g., communication through one or more antennas 758). Such wireless communication may include communication in accordance with WiFi communication technique, Long Term Evolution Advanced (LTE-A) communication technique, or other communication techniques.

I/O controller 750 can also include a module to allow system 700 to communicate with other devices or systems in accordance with to one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 715 can be arranged (e.g., can include terminals, such as pins) to allow system 700 to be coupled to an external device (or system). This may allow system 700 to communicate (e.g., exchange information) with such a device (or system) through connector 715. Connector 715 may be coupled to I/O controller 750 through a connection 716 (e.g., a bus).

Connector 715, connection 716, and at least a portion of bus 760 can include conductive lines that conform with at least one of USB, DP, HDMI, Thunderbolt, PCIe, Ethernet, and other specifications.

As shown in FIG. 7, each of processor 705, memory device 720, memory controller 730, graphics controller 740, and I/O controller 750 can include a clock generator 770. Clock generator 770 can include any of the clock generators described above with reference to FIG. 1 through FIG. 5. For example, clock generator 770 can include clock generator 100, 300, 500, and of FIG. 1, FIG. 3, FIG. 5, and FIG. 5, respectively. FIG. 7 shows an example where each of processor 705, memory device 720, memory controller 730, graphics controller 740, and I/O controller 750 can include clock generator 770. However, in some structures of system 700, fewer than all of processor 705, memory device 720, memory controller 730, graphics controller 740, and I/O controller 750 include clock generator 770.

FIG. 7 shows the components of system 700 arranged separately from each other as an example. For example, each of processor 705, memory device 720, memory controller 730, graphics controller 740, and I/O controller 750 can be located on a separate IC (e.g., semiconductor die or an IC chip). In some arrangements, two or more components processor 705, memory device 720, graphics controller 740, and I/O controller 750) of system 700 can be located on the same die (e.g., same IC chip) that forms a system-on-chip.

Figure 8:
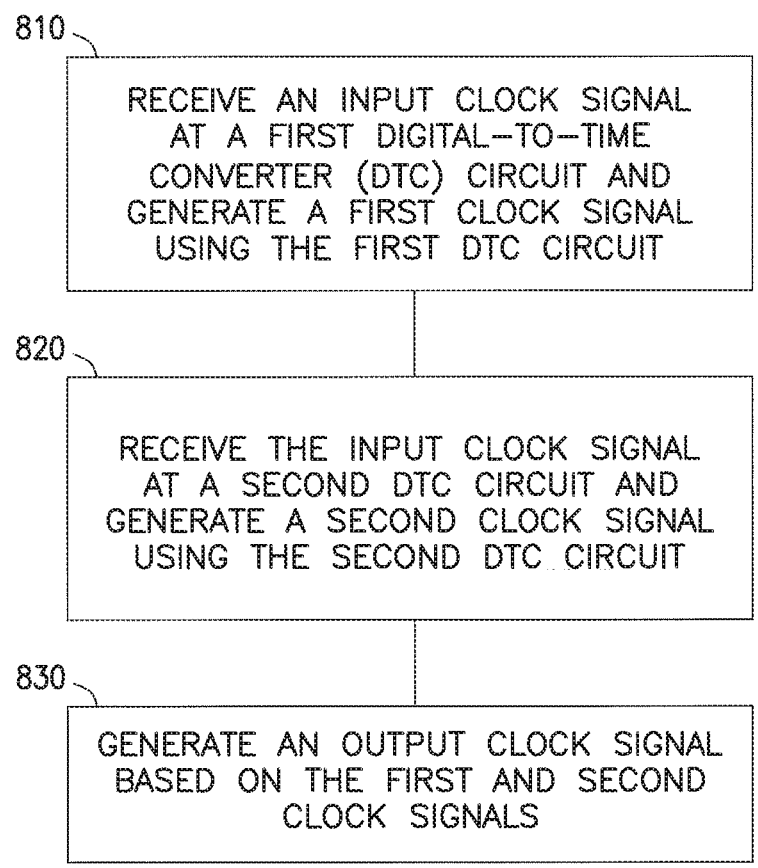
FIG. 8 is a flowchart showing a method of operating an electronic apparatus, according to some embodiments described herein.

FIG. 8 is a flowchart showing a method 800 of operating an apparatus, according to some embodiments described herein. The apparatus used in method 800 can include any of the apparatuses (e.g., clock generators 100, 300, and 500, and system 700) described above with reference to FIG. 1 through FIG. 7. Some of the activities in method 800 may be performed by hardware, software, firmware, or any combination of hardware, software, and firmware. For example, some of the activities in method 800 may be performed by hardware, software, firmware, or any combination of hardware, software, and firmware implemented in clock generators 100, 300, and 500, and system 700. The DTC circuits used in method 800 can include any of the DTC circuits described above with reference to FIG. 1 through FIG. 7.

As shown in FIG. 8, activity 810 of method 800 can include receiving an input clock signal at a first DTC circuit and generating a first clock signal using the first DTC circuit. Activity 820 can include receiving the input clock signal at a second DTC circuit and generating a second clock signal using the second DTC circuit. Activity 830 can include generating an output clock signal based on the first and second clock signals.

Method 800 can include fewer or more activities relative to activities 810, 820, and 830 shown in FIG. 8. For example, method 800 can include activities and operations of any of the receivers and their components described above with reference to FIG. 1 through FIG. 7.

The illustrations of the apparatuses (e.g., clock generators 100, 300, and 500, and system 700) and methods (e.g., method 800 and operations of clock generators 100, 300, and 500, and system 700) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

Additional Notes and Examples

Example 1 includes subject matter (such as a device, an electronic apparatus (e.g., circuit, electronic system, or both), or a machine) including a first digital-to-time converter (DTC) circuit to receive an input clock signal and generate a first clock signal based on the input clock signal, a second DTC circuit to receive the input clock signal and generate a second clock signal based on the input clock signal, and an output circuit to receive the first and second clock signals to generate an output clock signal based on the first and second clock signals.

In Example 2, the subject matter of Example 1 may optionally include, wherein the first DTC circuit is to control the rising edges of the output clock signal.

In Example 3, the subject matter of Example 1 or 2 may optionally include, wherein the second. DTC circuit is to control the falling edges of the output clock signal.

In Example 4, the subject matter of Example 1 may optionally include, wherein the output circuit includes a logic gate, the logic gate including a first input node coupled to an output node of the first DTC circuit, a second input node coupled to an output node of the second DTC circuit, and an output node to provide the output dock signal.

In Example 5, the subject matter of Example 4 may optionally include, wherein the logic gate includes an exclusive-OR (XOR) gate.

In Example 6, the subject matter of Example 1 may optionally include, wherein the output clock signal has a 50% duty cycle.

In Example 7, the subject matter of Example 1 may optionally include, wherein further comprising a third DTC circuit to receive the input clock signal and generate a third clock signal based on the input clock signal, wherein the output circuit is to generate the output clock signal based on the first, second, and third dock signals.

In Example 8, the subject matter of Example 7 may optionally include, wherein further comprising a fourth DTC circuit to receive the input clock signal and generate a fourth clock signal based on the input clock signal, wherein the output circuit is to generate the output clock signal based on the first, second, third, and fourth clock signals.

In Example 9, the subject matter of Example 1 may optionally include, wherein a frequency of the output clock signal is greater than a frequency of the input clock signal.

In Example 10, the subject matter of Example 1 may optionally include, wherein a frequency of the output clock signal is an integer multiple of a frequency of the input clock signal.

In Example 11, the subject matter of Example 11 may optionally include, wherein a frequency of the output clock signal is a non-integer multiple of a frequency of the input clock signal.

In Example 12, the subject matter of Example 11 may optionally include, wherein a frequency of at least one of the first and second clock signals is an integer multiple of a frequency of the input clock signal.

In Example 13, the subject matter of Example 1, wherein a frequency of at least one of the first and second clock signals is a non-integer multiple of a frequency of the input clock signal.

Example 14 includes subject matter (such as a device, an electronic apparatus (e.g., circuit, electronic system, or both), or a machine) including a node to receive and input clock signal, first circuitry including a first digital-to-time converter (DTC) circuit coupled to the node to generate a first clock signal based on the input clock signal, a second DTC circuit coupled to the node to generate a second clock signal based on the input clock signal, and a first circuit to receive the first and second clock signals to generate a first output clock signal based on the first and second clock signals, and second circuitry including a DTC circuit coupled to the node to generate a third clock signal based on the input clock signal, a fourth DTC circuit coupled to the node to generate a fourth clock signal based on the input clock signal, and a second circuit to receive the third and fourth clock signals to generate a second output signal based on the third and fourth clock signals, wherein the first and second output clock signals have different frequencies.

In Example 15, the subject matter of Example 14 may optionally include, wherein the first circuit includes a first logic gate including a first input node coupled to an output node of the first DTC circuit, a second input node coupled to an output node of the second DTC circuit, and an output node to provide the first output clock signal, and the second circuit includes a second logic gate including a first input node coupled to an output node of the third DTC circuit, a second input node coupled to an output node of the fourth DTC, circuit, and an output node to provide the second output clock signal.

In Example 16, the subject matter of Example 15 may optionally include, wherein a frequency of at least one of the first and second output clock signals is an integer multiple of a frequency of the input clock signal.

In Example 17, the subject matter of Example 15 may optionally include, wherein a frequency of at least one of the first and second output clock signals is a non-integer multiple of a frequency of the input clock signal.

Example 18 includes subject matter (such as a device, an electronic apparatus (e.g., circuit, electronic system, or both), or a machine) including conductive lines, a first device coupled to the conductive lines, and a second device coupled to the conductive lines, the second device including a phase locked loop (PLL) and a digital-to-time circuitry coupled to the PLL, the digital-to-time circuitry including a first digital-to-time converter (DTC) circuit to receive an input clock signal from the PLL and generate a first clock signal based on the input clock signal, a second DTC to receive the input clock signal from the PLL and generate a second clock signal based on the input clock signal, and a circuit to receive the first and second clock signals to generate an output clock signal based on the first and second clock signals.

In Example 19, the subject matter of Example 18 may optionally include, wherein one of the first and second devices includes an integrated circuit chip.

In Example 20 the subject matter of any of Example 18 or 19 may optionally include, wherein the conductive lines conform with at least one of Universal Serial Bus (USB), DisplayPort (DP), High-Definition Multimedia Interface (HDMI), Thunderbolt, Ethernet, and Peripheral Component Interconnect Express (PCIe) specifications.

Example 21 includes subject matter (such as a method of operating a device, an electronic apparatus (e.g., circuit, electronic system, or both), or a machine) including receiving an input clock signal at a first digital-to-time converter (DTC) circuit and generating a first clock signal using the first DTC circuit, receiving the input clock signal at a second DTC circuit and generating a second clock signal using the second DTC circuit, and generating an output clock signal based on the first and second clock signals.

In Example 22, the subject matter of Example 21 may optionally include, wherein generating the output clock signal includes performing a logic operation on the first and second clock signals to generate the output clock signal.

In Example 23, the subject matter of Example 21 may optionally include, wherein generating the output clock signal includes controlling rising edges of the output signal using the first DTC.

In Example 24, the subject matter Example 23 may optionally include, wherein generating the output clock signal includes controlling falling edges of the output signal using the second DTC.

Example 25 includes subject matter (such as a device, an electronic apparatus (e.g., circuit, electronic system, or both), or machine) including means for performing any of the methods of Examples 21-24.

The subject matter of Example 1 through Example 25 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

In the detailed description and the claims, a list of items joined by the term "at least one of" can mean any combination of the listed items. For example, if items A and B are listed, then the phrase "at least one of A and B" can mean A only; B only; or A and B. In another example, if items A, B, and C are listed, then the phrase "at least one of A, B and C" can mean A only; B only; C only; A and B; A and C; B and C; or A, B, and C. Each of A, B, and C can include a single element or a plurality of elements.

The Abstract is provided to comply with 37 C.F.R. Section 1.72(b) requiting an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
    a first digital-to-time converter (DTC) circuit to receive an input clock signal and generate a first clock signal based on the input clock signal;
    a second DTC circuit to receive the input clock signal and generate a second clock signal based on the input clock signal; and
    an output circuit to receive the first and second clock signals to generate an output clock signal based on a logical combination of the first and second clock signals.

2. The apparatus of claim 1, wherein the first DTC circuit is to control the rising edges of the output clock signal.

3. The apparatus of claim 1, wherein the second DTC circuit is to control the falling edges of the output clock signal.

4. The apparatus of claim 1, wherein a frequency of at least one of the first and second clock signals is an integer multiple of a frequency of the input clock signal.

5. The apparatus of claim 1, wherein a frequency of at least one of the first and second clock signals is a non-integer multiple of a frequency of the input clock signal.

6. The apparatus of claim 1, wherein the output clock signal has a 50% duty cycle.

7. The apparatus of claim 1, further comprising:
    a third DTC circuit to receive the input clock signal and generate a third clock signal based on the input clock signal, wherein the output circuit is to generate the output clock signal based on the first, second, and third clock signals.

8. The apparatus of claim 7, further comprising:
    a fourth DTC circuit to receive the input clock signal and generate a fourth clock signal based on the input clock signal, wherein the output circuit is to generate the output clock signal based on the first, second, third, and fourth clock signals.

9. The apparatus of claim 1, wherein a frequency of the output clock signal is greater than a frequency of the input clock signal.

10. The apparatus of claim 1, wherein a frequency of the output clock signal is an integer multiple of a frequency of the input clock signal.

11. The apparatus of claim 1, wherein a frequency of the output clock signal is a non-integer multiple of a frequency of the input clock signal.

12. An apparatus comprising:
    a first digital-to-time converter (DTC) circuit to receive an input clock signal and generate a first clock signal based on the input clock signal;
    a second DTC circuit to receive the input clock signal and generate a second clock signal based on the input clock signal; and
    an output circuit to receive the first and second clock signals to generate an output clock signal based on the first and second clock signals, wherein the output circuit includes a logic gate, the logic gate including a first input node coupled to an output node of the first DTC circuit, a second input node coupled to an output node of the second DTC circuit, and an output node to provide the output clock signal.

13. The apparatus of claim 12, wherein the logic gate includes an exclusive-OR (XOR) gate.

14. An apparatus comprising:
a node to receive an input clock signal;
first circuitry including:
   a first digital-to-time converter (DTC) circuit coupled to the node to generate a first clock signal based on the input clock signal, a second DTC circuit coupled to the node to generate a second clock signal based on the input clock signal, and a first circuit to receive the first and second clock signals to generate a first output clock signal based on a logical combination of the first and second clock signals; and
second circuitry including:
a third DTC circuit coupled to the node to generate a third clock signal based on the input clock signal, a fourth DTC circuit coupled to the node to generate a fourth clock signal based on the input clock signal, and a second circuit to receive the third and fourth clock signals to generate a second output signal based on a logical combination of the third and fourth clock signals, wherein the first and second output clock signals have different frequencies.

15. An apparatus comprising:
a node to receive an input clock signal;
first circuitry including:
   a first digital-to-time converter (DTC) circuit coupled to the node to generate a first clock signal based on the input clock signal, a second DTC circuit coupled to the node to generate a second clock signal based on the input clock signal, and a first circuit to receive the first and second clock signals to generate a first output clock signal based on the first and second clock signals; and
second circuitry including:
   a DTC circuit coupled to the node to generate a third clock signal based on the input clock signal, a fourth DTC circuit coupled to the node to generate a fourth clock signal based on the input clock signal, and a second circuit to receive the third and fourth clock signals to generate a second output signal based on the third and fourth clock signals, wherein the first and second output clock signals have different frequencies, wherein:
   the first circuit includes a first logic gate including a first input node coupled to an output node of the first DTC circuit, a second input node coupled to an output node of the second DTC circuit, and an output node to provide the first output clock signal; and
   the second circuit includes a second logic gate including a first input node coupled to an output node of the third DTC circuit, a second input node coupled to an output node of the fourth DTC circuit, and an output node to provide the second output clock signal.

16. The apparatus of claim 15, wherein a frequency of at least one of the first and second output clock signals is an integer multiple of a frequency of the input clock signal.

17. The apparatus of claim 15, wherein a frequency of at least one of the first and second output clock signals is a non-integer multiple of a frequency of the input clock signal.

18. An apparatus comprising:
conductive lines;
a first device coupled to the conductive lines; and
a second device coupled to the conductive lines, the second device including a phase locked loop (PLL) and a digital-to-time circuitry coupled to the PLL, the digital-to-time circuitry including:
a first digital-to-time converter (DTC) circuit to receive an input clock signal from the PLL and generate a first clock signal based on the input clock signal;
a second DTC to receive the input clock signal from the PLL and generate a second clock signal based on the input clock signal; and
a circuit to receive the first and second clock signals to generate an output clock signal based on the first and second clock signals.

19. The apparatus of claim 18, wherein one of devices includes an integrated circuit chip.

20. The apparatus of claim 18, wherein the conductive lines conform with at least one of Universal Serial Bus (USB), DisplayPort (DP), High-Definition Multimedia Interface (HDMI), Thunderbolt, Ethernet, and Peripheral Component Interconnect Express (PCIe) specifications.

* * * * *

UNITED STATES PATENT AND TRADEMARK OFFICE
CERTIFICATE OF CORRECTION

Page 1 of 1

PATENT NO. : 9,941,898 B1
APPLICATION NO. : 15/391575
DATED : April 10, 2018
INVENTOR(S) : Banin et al.

It is certified that error appears in the above-identified patent and that said Letters Patent is hereby corrected as shown below:

In the Claims

In Column 14, Line 34, in Claim 19, after "of", insert --the first and second--

Signed and Sealed this
Fourth Day of June, 2019

Andrei Iancu
*Director of the United States Patent and Trademark Office*